United States Patent
Jazebi et al.

(10) Patent No.: US 10,971,926 B2
(45) Date of Patent: Apr. 6, 2021

(54) TAPE LIFETIME MONITOR IN FAULT CURRENT LIMITER

(71) Applicant: Varian Semiconductor Equipment Associates, Inc., Gloucester, MA (US)

(72) Inventors: Saeed Jazebi, Peabody, MA (US); John Evans, Boxford, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 355 days.

(21) Appl. No.: 15/958,068

(22) Filed: Apr. 20, 2018

(65) Prior Publication Data

US 2019/0267799 A1    Aug. 29, 2019

Related U.S. Application Data

(60) Provisional application No. 62/634,586, filed on Feb. 23, 2018.

(51) Int. Cl.
| | |
|---|---|
| *H02H 9/02* | (2006.01) |
| *H02H 7/00* | (2006.01) |
| *H01L 39/16* | (2006.01) |
| *G01R 33/12* | (2006.01) |

(52) U.S. Cl.
CPC ......... *H02H 9/023* (2013.01); *G01R 33/1246* (2013.01); *H02H 7/001* (2013.01); *H01L 39/16* (2013.01)

(58) Field of Classification Search
CPC .......... H01F 6/02; H02H 7/001; H02H 9/023; H02H 3/08; H02H 9/02; H02H 9/021
See application file for complete search history.

(56) References Cited

U.S. PATENT DOCUMENTS

| | | | | |
|---|---|---|---|---|
| 7,304,826 B2* | 12/2007 | Yuan | .................... | H02H 7/001 361/19 |
| 8,873,205 B2* | 10/2014 | Husband | ............... | H02H 9/023 361/8 |
| 2006/0274458 A1* | 12/2006 | Tekletsadik | ............. | H01L 39/20 361/19 |
| 2011/0032650 A1* | 2/2011 | Hwan | .................... | H02H 3/066 361/71 |
| 2012/0236440 A1* | 9/2012 | Amato | .................... | H02H 9/023 361/19 |

(Continued)

*Primary Examiner* — Gustavo A Rosario-Benitez
(74) *Attorney, Agent, or Firm* — Kacvinsky Daisak Bluni PLLC

(57) ABSTRACT

An apparatus for controlling and monitoring the lifetime of a superconducting fault current limiter. The apparatus may include a processor; and a memory unit coupled to the processor, including a lifetime routine, where the lifetime routine is operative on the processor to monitor the superconducting fault current limiter. The lifetime routine may include a lifetime estimation processor to receive a set of fault information for a fault event of a superconductor tape of the superconducting fault current limiter, determine a present state of the superconductor tape based upon the set of fault information, and determine an estimated lifetime of the superconductor tape based upon the present state. The present state may be determined from additional information such as fault history on the superconducting fault current limiter, as well as a database of superconductor tape behavior with respect to various faults.

15 Claims, 4 Drawing Sheets

(56) References Cited

U.S. PATENT DOCUMENTS

| | | | |
|---|---|---|---|
| 2012/0316070 A1* | 12/2012 | Murphy | H01L 39/16 |
| | | | 505/163 |
| 2013/0221979 A1* | 8/2013 | Tekletsadik | G01R 31/00 |
| | | | 324/537 |
| 2013/0225414 A1* | 8/2013 | Amato | G01R 33/1238 |
| | | | 505/163 |
| 2016/0333856 A1* | 11/2016 | Zabalza | G05F 5/00 |
| 2017/0316894 A1* | 11/2017 | Choi | H02H 7/001 |
| 2017/0365998 A1* | 12/2017 | Luscan | H01H 9/56 |
| 2018/0034258 A1* | 2/2018 | Schweitzer, III | H02H 3/20 |
| 2020/0006933 A1* | 1/2020 | Legendre | H01H 33/596 |

* cited by examiner

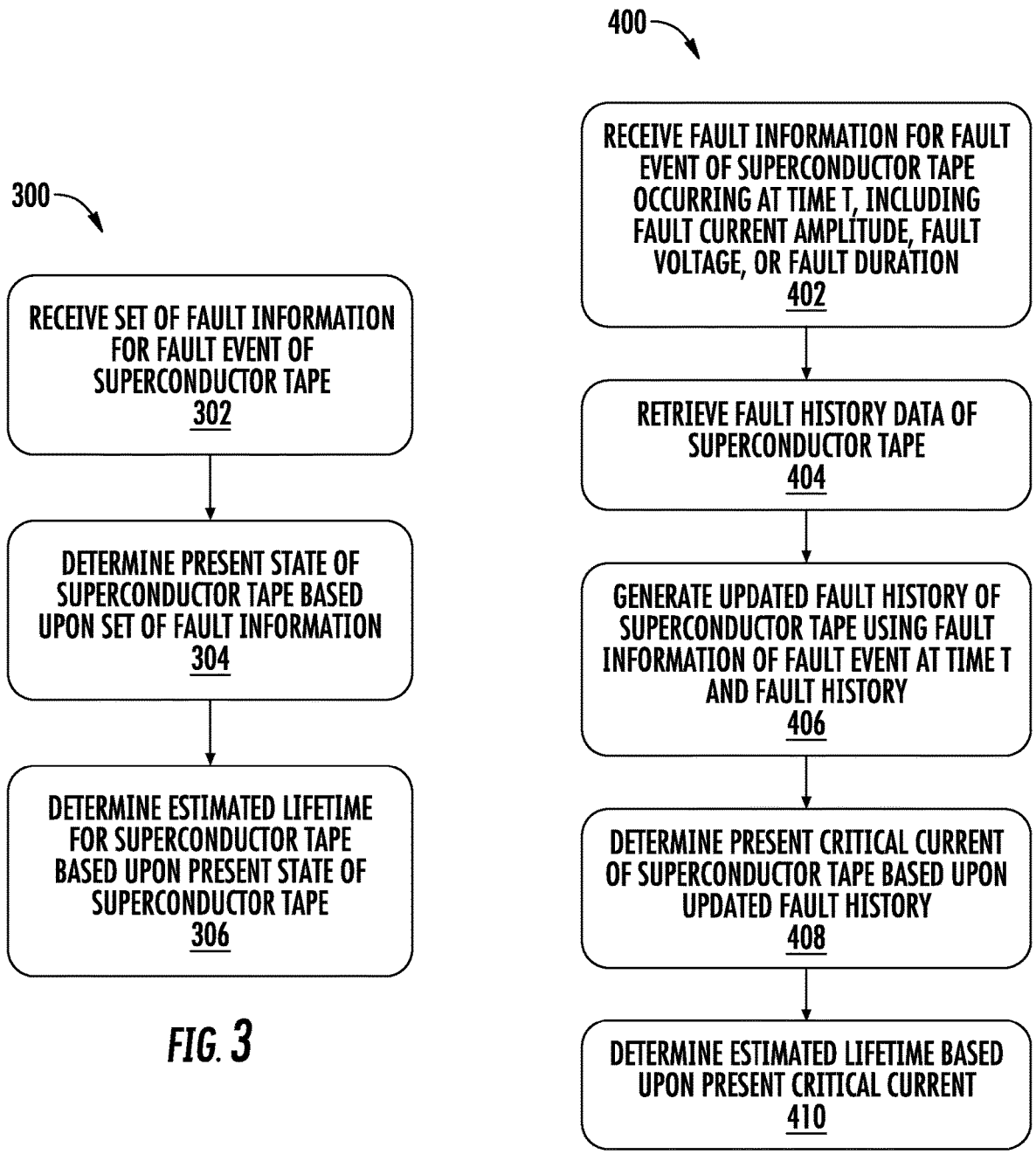

TAPE LIFETIME MONITOR IN FAULT CURRENT LIMITER

RELATED APPLICATIONS

This application claims priority to U.S. Provisional Patent Application No. 62/634,586, filed Feb. 23, 2018, entitled TAPE LIFETIME MONITOR IN FAULT CURRENT LIMITER, and incorporated by reference herein in its entirety.

FIELD

This disclosure relates to current protection devices, and more particularly to a monitoring for tape structures of superconductor fault current limiters.

BACKGROUND

A fault current limiter (FCL) is a device for limiting fault currents, such as in a power system. Various types of FCLs have been developed over the last several decades, including superconducting fault current limiters (SCFCLs), solid state fault current limiters, inductive fault current limiters, as well as other varieties known in the art. FCLs may be implemented in a system having generation, transmission, and distribution networks for providing power to various industrial, commercial, and/or residential electrical loads.

A fault current is an abnormal current in an electrical system resulting from a fault in the system, such as a short circuit. A fault current may arise in a system due to any number of events or failures, such as power lines or other system components being damaged by severe weather (e.g. lightning strikes). When such a fault occurs, a large current (a fault current) can quickly appear in the circuit as the current is no-longer limited by load. This surge of current is undesirable because of potential damage to the load, including the network itself, or equipment connected to the network.

Many superconducting fault current limiters are based upon high-critical temperature (high $T_C$) superconductor materials having a $T_C$ above the boiling point of liquid nitrogen (77 K). These materials are also characterized by a critical current, $I_C$, a parameter referring to the maximum current the superconductor may transmit at a given temperature, above which maximum current the superconductor transitions to normal state conductivity, having a finite resistance. Immersing in liquid nitrogen enables the superconductor tapes to be sufficiently cooled to be in the superconducting state and to conduct current without resistance loss during normal operation. When a fault condition takes place, the current passing through the superconductor tape exceeds $I_C$ of the tape, causing the superconductor tape to transition or "quench" to a normal state conductor. As a normal state conductor, the superconductor tape presents resistance to current flow, generating heat, where the heat changes the temperature of the superconductor tape anywhere in the interval of 77 K-600 K in many instances. In known fault current limiters, after the fault event passes, the superconductor tape cools back down and is restored to a superconducting state, wherein the fault current limiter may be placed back on-line for operation.

Notably, known high $T_C$ superconductor tapes are based upon oxide-type superconductor materials, including those based upon $Re_1Ba_2Cu_3O_{7-x}$ materials, where Re stands for a rare earth element. As a result of the quenching and heating phenomenon, the superconductor tape may lose a certain amount of $O_2$ every time a fault takes place, where oxygen loss degrades the superconducting properties, as is known. The occurrence of faults may also degrade critical current of the superconductor tape to the extent where, after a given number of faults, the superconductor tape may fail, meaning the superconductor tape can no longer be restored to a superconducting state, at least at the level of current designed to pass through the fault current limiter for normal operation.

When a superconductor module of a superconducting fault current limiter fails, the failure may be inconvenient and costly to fix. Moreover, at present, the ability to predict failure or lifetime of a superconductor tape is lacking.

With respect to these and other considerations the present disclosure is provided.

BRIEF SUMMARY

In one embodiment, an apparatus for controlling a superconducting fault current limiter may include a processor, and a memory unit coupled to the processor, including a lifetime routine, where the lifetime routine is operative on the processor to monitor the superconducting fault current limiter. The lifetime routine may include a lifetime estimation processor to receive a set of fault information for a fault event of a superconductor tape of the superconducting fault current limiter. The lifetime estimation processor may determine a present state of the superconductor tape based upon the fault information, and determine an estimated lifetime of the superconductor tape based upon the present state.

In another embodiment, a superconducting fault current limiter system may include a superconducting fault current limiter unit, a condition monitor, coupled to the superconducting fault current limiter unit, and a controller, coupled to the condition monitor. The controller may include a processor, and a memory unit coupled to the processor, including a lifetime routine, where the lifetime routine is operative on the processor to monitor the superconducting fault current limiter. The lifetime routine may include a lifetime estimation processor to receive a set of fault information for a fault event of a superconductor tape of the superconducting fault current limiter. The lifetime estimation processor may determine a present state of the superconductor tape based upon the fault information, and determine an estimated lifetime of the superconductor tape based upon the present state.

In a further embodiment, a method for controlling a superconducting fault current limiter may include receiving a set of fault information for a fault event of a superconductor tape of a superconducting fault current limiter. The method may further include determining a present state of the superconductor tape based upon the fault information, and determining an estimated lifetime of the superconductor tape based upon the present state. The set of fault information may include fault current amplitude of the fault event, fault voltage of the fault event, fault duration, calculated energy of the fault event, or any combination thereof.

BRIEF DESCRIPTION OF THE DRAWINGS

The accompanying drawings illustrate exemplary approaches of the disclosure, including the practical application of the principles thereof, as follows:

FIG. 3 depicts a process flow according to embodiments of the disclosure;

FIG. 4 depicts another process flow according to embodiments of the disclosure;

Figure 1:
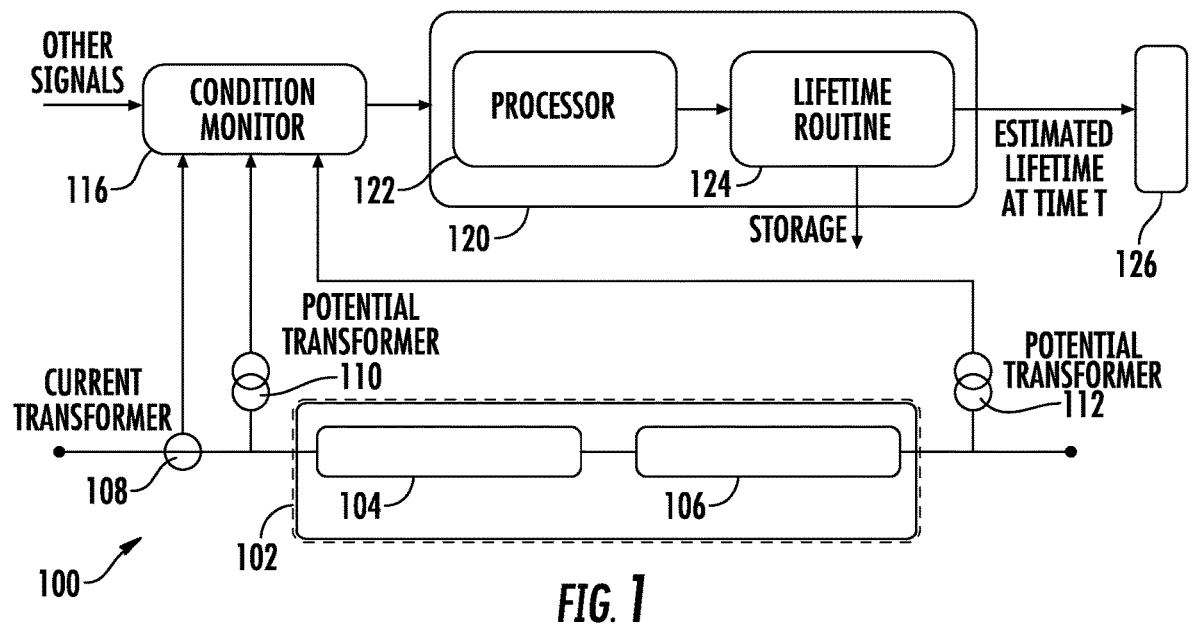
FIG. 1 depicts a superconductor fault current limiter system according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, references to "one embodiment" or "some embodiments" of the present disclosure may be interpreted as including the existence of additional embodiments also incorporating the recited features.

The present embodiments provide improved approaches for monitoring and controlling superconducting fault current limiters (SCFCLs). In various embodiments, monitoring and control may be implemented using a controller located proximate or alternatively remotely from the SCFCL.

FIG. 1 shows a SCFCL system, shown as system 100, in accordance with various embodiments of the disclosure. The system 100 may include a superconducting fault current limiter unit, shown as SCFCL 102, arranged according to known SCFCLs. The SCFCL 102 may include a superconducting unit 104 and a current protection unit 106. The superconducting unit 104 may be arranged with known superconductor tapes, such as high TC tapes based upon $Re_1Ba_2Cu_3O_{7-x}$ materials, or other materials having a TC above 77 K. As such, the superconducting unit 104 is arranged to operate in a cooling medium such as liquid nitrogen. The superconducting unit 104 may accordingly transport electrical current (hereinafter "current") with no resistance under normal operating conditions. The level of current to be conducted through the superconducting unit 104 under normal operating conditions may be arranged to be below a target level based upon the $I_C$ of the superconductor tape or superconductor tapes of the superconducting unit 104.

The current protection unit 106 may be arranged to operate at ambient temperature, where the current protection unit 106 may act to limit current in a fault event, as well as to restore operation of the superconductor unit after the fault event. As such, the current and energy dissipated through a superconductor tape(s) of the superconducting unit 104 may be limited for a given fault event.

The system 100 further includes a current transformer 108, connected to the SCFCL 102, to measure current through the SCFCL 102, as well as a first potential transformer 110, and a second potential transformer 112. As shown FIG. 1, first potential transformer 110, second potential transformer 112, the superconducting unit 104 and current protection unit 106 may be arranged in electrical series, wherein the first potential transformer 110 and second potential transformer 112 are positioned to measure a voltage drop across the superconductor unit and current protection unit 106.

The system 100 further includes a condition monitor 116, coupled to receive information generated by the SCFCL 102, including current, voltage, temperature, and other information. In various embodiments, the condition monitor 116 is coupled to the current transformer 108, first potential transformer 110, and second potential transformer 112, to receive current information, as well as voltage information, generated at the SCFCL 102.

The system 100 further includes a controller 120, where the operation of controller 120 is detailed below with respect to FIGS. 2-5. The controller 120 may be located proximate the SCFCL 102, such as at a same site of the SCFCL 102, adjacent the SCFCL 102, or remotely from the SCFCL 102. The controller 120 may be coupled to receive information from the condition monitor 116, at regular intervals, episodically, such as after fault events, or upon receipt of user input, for example. The system 100 may further include a user interface 126, which component may be located proximate the controller 120, proximate the SCFCL 102, or remotely from the controller 120 and the SCFCL 102. The user interface 126 may be any suitable component including visual or audible device, including input devices to receive user input, as well as output devices to generate signal for a user, such as audible signals, display signals, and so forth. The controller 120 may include a processor 122 and a lifetime routine 124. In brief, the lifetime routine 124 may receive and store various fault information related to the SCFCL 102. The lifetime routine 124 may further generate estimated lifetime of superconductor tapes of the SCFCL 102. The estimated lifetime may aid in controlling the SCFCL 102, including managing replacement of superconductor tapes as needed.

Figure 2A:
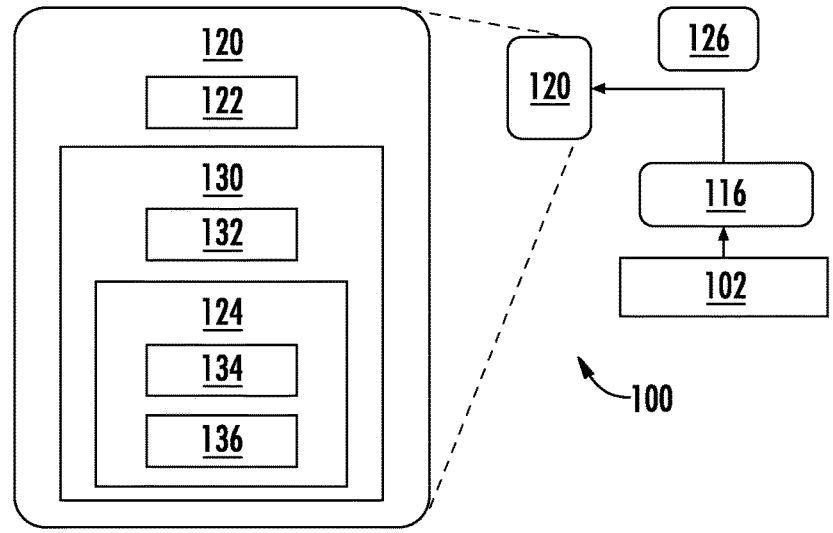
FIG. 2A depicts details of a controller of a fault current limiter system and associated components in accordance with embodiments of the disclosure.

Turning now to FIG. 2A, there is shown another depiction of the system 100, including details of the controller 120. In various embodiments, the controller 120 may include a processor 122, such as a known type of microprocessor, dedicated semiconductor processor chip, general purpose semiconductor processor chip, or similar device. The controller 120 may further include a memory or memory unit 130, coupled to the processor 122, where the memory unit 130 contains a lifetime routine 124. The lifetime routine 124 may be operative on the processor 122 to monitor the superconducting fault current limiter, as described below.

The memory unit 130 may comprise an article of manufacture. In one embodiment, the memory unit 130 may comprise any non-transitory computer readable medium or machine readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

As further shown in FIG. 2A, the lifetime routine 124 may include a lifetime estimation processor 134, as well as a data management processor 136. According to some embodiments, the lifetime estimation processor 134 may receive a set of fault information for a fault event of a superconductor tape of the SCFCL 102, and may determine a present state of the superconductor tape based upon the fault information. The lifetime estimation processor 134 may further determine an estimated lifetime of the superconductor tape based upon the present state. In other words, the lifetime estimation processor 134 may use data collected from a fault event at the SCFCL 102 to project the remaining lifetime of superconductor tape(s) of the SCFCL. The lifetime may be expressed as an appropriate parameter, such as energy-to-failure, or other metric, as described below. The data management processor 136 may manage and store various information, such as storing fault history data.

Figure 2B:
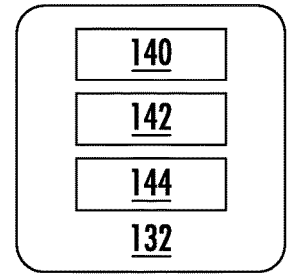
FIG. 2B depicts details of a memory unit, according to some embodiments of the disclosure.

As also shown in FIG. 2A, the memory unit 130 may include a database 132, where details of the database 132 are provided in FIG. 2B. As shown in FIG. 2B, the database 132 may include factory data 140, including statistical data gathered at the time of manufacturing or quality control operations for the superconductor tapes of the SCFCL 102 before deployment in the field. The database 132 may further include fault history data 142, including historical data of fault event information collected when the SCFCL 102 is in the field. The database 132 may also include a model 144, representing a model for behavior of the superconductor tape(s) of the SCFCL 102, such as a routine based on the electro-then al and electromagnetic behavior of the superconducting tapes in a liquid $N_2$ bath.

As further explained below, for example, the lifetime estimation processor 134 may compare historical data of the superconductor tapes of the SCFCL 102, collected in the field, and correlate the historical data to the statistical data gathered during the manufacturing or quality control phase. The lifetime estimation processor 134 may then use fault event parameters such as the calculated energy levels, current pulses, and number of fault events, to calculate the remaining lifetime of the superconducting tapes, thus generating an estimated lifetime of the superconductor tape at a given time T.

In operation, the condition monitor 116 may periodically or occasionally receive information from the SCFCL 102. When a fault event takes place, the condition monitor may automatically receive fault information such as fault current from the current transformer 108, as well as voltage readings from the first potential transformer 110 and the second potential transformer 112. For example, the condition monitor 116 may be positioned locally near the SCFCL 102 and may accordingly collect information during a given fault event. As such, the fault current, as well as fault voltage between the first potential transformer 110 and the second potential transformer 112 may be automatically collected and stored. Additionally, the condition monitor may record the fault duration of a fault event. In some embodiments, the fault information for a given fault event may be automatically forwarded to the controller 120 at the time of the fault event. Alternatively, the condition monitor 116 may be configured to periodically send the latest fault information to the controller 120, or the controller 120 may periodically query the condition monitor 116. In some embodiments, the controller 120 may send for fault information from the condition monitor 116 based upon user input.

Either automatically upon receipt of fault information from the condition monitor 116, or upon user input received from user interface 126, the controller 120 may generate an estimated lifetime for the superconductor tapes of the SCFCL 102, at a given time, such as at a time T. In this manner, a user may be informed of the remaining lifetime for superconductor tapes, allowing for any appropriate action to be taken in a timely manner.

Turning now to FIG. 3, there is shown a process flow 300, according to some embodiments of the disclosure. The process flow may be implemented by a component or components of the controller 120, including the lifetime estimation processor. At block 302, a set of fault information is received for a fault event of a superconductor tape of an SCFCL. The set of fault information may be received at a controller, such as controller 120, described above. At block 304, a present state of the superconductor tape may be determined based upon the received fault information. As detailed below, the present state may entail properties of the superconductor tape, fault history associated with the superconductor tape, and so forth. The present state may be determined by operations to estimate properties of the superconductor tape at a given time, time T. At block 306, an estimated lifetime is determined for the superconductor tape based upon the present state. As detailed below, operations to determine the estimated lifetime may account for factory data collected for the superconductor tape, fault history of the superconductor tape, models of the superconductor tape behavior, current to be used in an SCFCL during normal operation, and so forth.

Turning now to FIG. 4, there is shown another process flow 400, according to additional embodiments of the disclosure. At block 402, fault information associated with a superconductor tape is received, where the fault information includes fault current amplitude, fault voltage, or fault duration, or any combination of these parameters. Proceeding to block 404, the fault history of the superconductor tape associated with the fault information is retrieved. For example, the fault history may be reflected in a summation of relevant parameters at least one previous fault event, including number of past current pulses, amplitude, fault voltage, normal operation current before fault events, energy of each fault, and other data. At block 406, an updated fault history is generated for the superconductor tape, based upon the fault history and the fault information for the fault event at time T. In this manner the updated fault history includes fault information for the superconductor tape including fault events occurring at time T or before. At block 408, a present critical current is determined for the superconductor tape based upon the updated fault history. As such, the present critical current reflects the estimated critical current of the superconductor tape based upon all fault events of the superconductor tape having taken place up to an including time T. As detailed below, the determination of critical current may also take into account factory data, as well as electrothermal and electromagnetic model behavior of the superconductor tape. At block 410, the estimated lifetime of the superconductor tape is determined based upon the present critical current.

Figure 5:
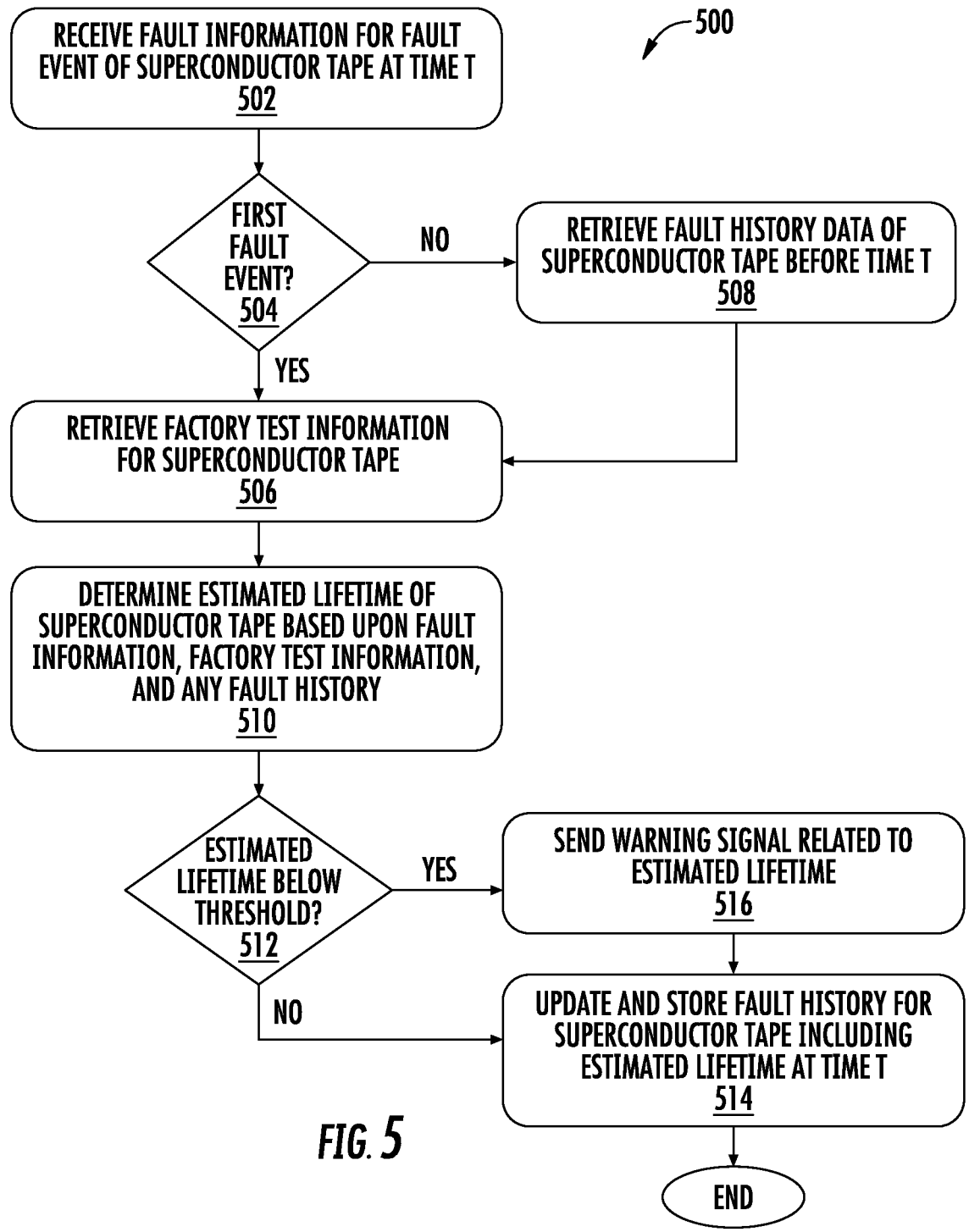
FIG. 5 depicts a further process flow according to embodiments of the disclosure.

Turning now to FIG. 5, there is shown another process flow 500, according to further embodiments of the disclosure. At block 502, fault information is received for a fault event associated with a superconductor tape at time T. At block 504, if the fault information is related to a first fault event for the superconductor tape, the flow proceeds directly to block 506, where factory test information is retrieved for the superconductor tape. If the fault event is not a first fault event, the flow proceeds to block 508 where the fault history of the superconductor tape is retrieved for fault events before time T. The flow then proceeds to block 506. In various embodiments, the factory test information may include specific data related to the superconductor tape response to application of current and voltage.

At block 510, the estimated lifetime of the superconductor tape is determined based upon the fault information of the fault event at time T, factory test information, as well as any fault history of the superconductor tape. At block 512, if the estimated lifetime is below a threshold, the flow proceeds to block 514, where the fault history is updated and stored, for example, by a data management processor 136, for the superconductor tape(s) in question, including the estimated lifetime at time T. In various embodiments, the estimated lifetime may be expressed in terms of fault energy, number of fault events, or other suitable metric to indicate the remaining lifetime of the superconductor tape. For example, the estimated lifetime may be based in part upon a critical current of the superconductor tape determined at time T. In some instances, the SCFCL containing the superconductor tape(s) in question may be designed to operate at a target current level under normal conditions when the superconductor tapes in the superconducting state, such as 500 amps RMS. To function properly, the critical current determined for the superconductor tape is set to be above the target current level, so the current passing through the superconductor tape does not exceed IC and the superconductor tape remains in the superconducting state during normal operation. Each fault event sustained by the superconductor tape may degrade the properties to the extent where IC decreases, approaching the target current level for normal conditions. As the determined value of the IC as well as other properties of the superconductor tape degrades, the number of future fault events and the intensity of such events decreases, before the superconductor tape is no longer capable of transmitting the target current level. Thus, the estimated lifetime at a given time T for the superconductor tape may be expressed in terms of fault event parameters, such as total fault energy before failure.

If, at block 512, the estimated lifetime is below the threshold, the flow proceeds first to block 516 before proceeding to block 514. At block 516, a warning signal is sent regarding the estimated lifetime. The threshold may be set to allow time for action to be taken to replace a superconductor tape(s) of an SCFCL before failure. For example, based upon the fault history, factory data, electrochemical/electromagnetic models, and other information, a determination may be made as to expected degradation in IC for a subsequent fault event. If the expected degradation in IC for the next fault event brings $I_C$ of the superconductor tape below the target current level for normal operation, or if the expected degradation brings $I_C$ too close to the target current level, a warning signal may be generated. For example, the warning signal may be sent to a user interface to apprise a user to take action to replace the unit containing the superconductor tapes. In this manner, timely replacement of SCFCL tapes can be performed.

Figure 6:
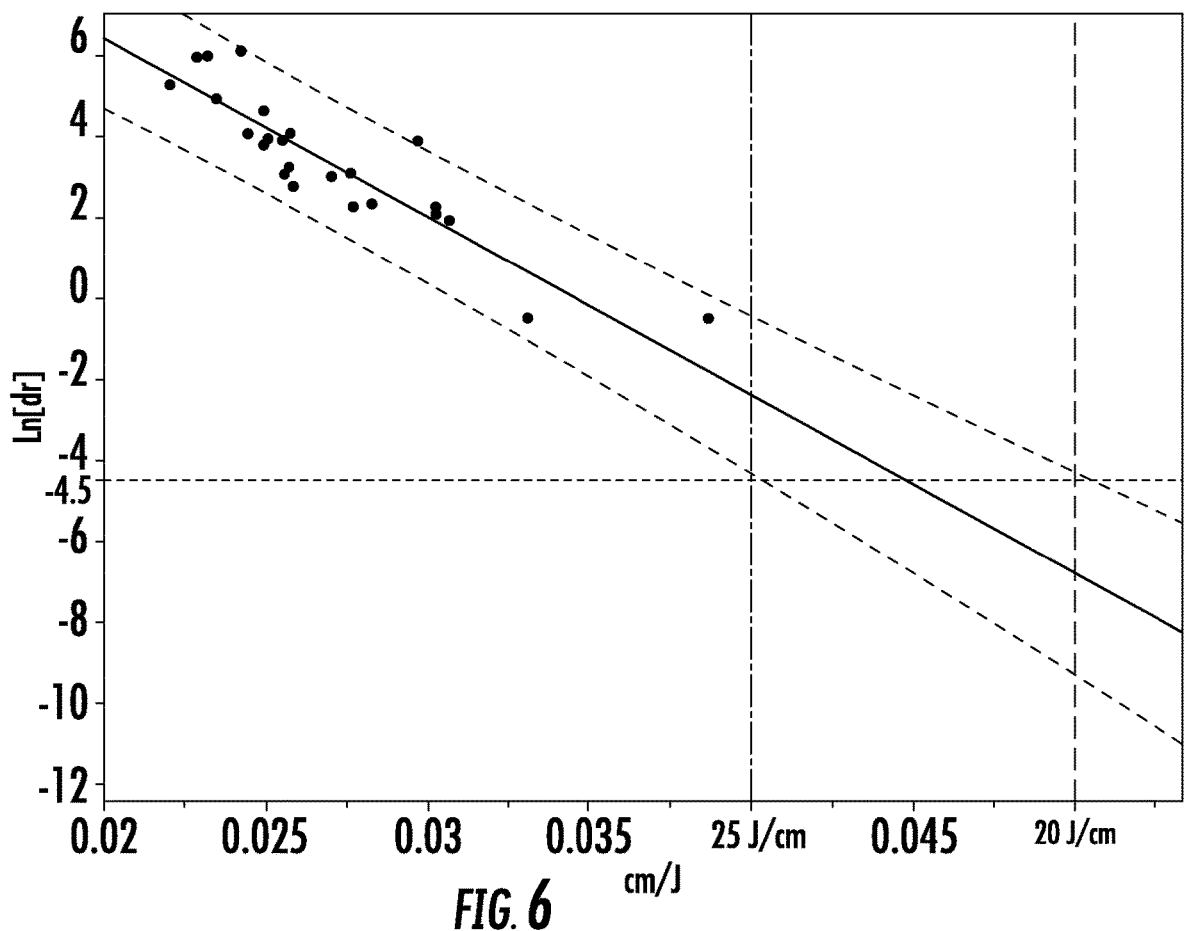
FIG. 6 depicts exemplary data showing degradation of critical current of superconductor tapes as a function of energy of a pulse dissipated by the superconductor tapes.

According to various embodiments, the critical current of a superconductor tape at a time T may be determined based upon a predetermined characteristic of the superconductor tape and the fault event history of the superconductor tape. The predetermined characteristic of the superconductor tape may entail an empirical model of critical current degradation as a function of current amplitude of a current pulse. The predetermined characteristic may be determined by statistical data collected at the factory during qualification of the superconducting tape. FIG. 6 is a graph showing the natural logarithm of the degradation rate of $I_C$ per current pulse (ln[dr]) as a function of applied energy of the current pulse for an exemplary superconductor tape. The data of FIG. 6 is collected from different samples over different energy levels of energy pulses, where the X-axis plots the energy (in Joules, J) of a pulse per unit length of the superconductor tape in centimeters (J/cm), or the inverse (cm/J). The energy of the pulse may be taken as the integral over the duration of the pulse of the dissipated power, where the power dissipated by the superconductor tape is IV, the product of current and voltage. The critical current or degradation of critical current of a superconductor tape may be measured by measuring critical current before and after a given energy pulse. As shown in FIG. 6, the greater values of ln[dr] indicate a more rapid loss of critical current. FIG. 6 illustrates the logarithm of degradation of critical current shows a linear dependence on the inverse of pulse energy per unit length of superconductor tape, or cm/J. Thus, higher degradation rates are present with lower values of cm/J or higher values of J/cm. The solid line is a linear fit to the data, illustrating, for example at 25 J/cm the value of Ln [dr] is approximately −2. Thus, at a value of 25 J/cm, the degradation rate of critical current of the superconductor tape is on the order of 1%, while at 20 J/cm (Ln[dr]=−7), the degradation rate is negligible. At a value of 40 J/cm (0.024 cm/J), the logarithm of degradation rate is approximately 4, indicating a very rapid degradation rate.

Thus, the above data of FIG. 6 may be used to determine the critical current of a superconductor tape in an SCFCL deployed in the field. The initial critical current of the superconductor tape may be measured at the factory at the time of deployment in an SCFCL in the field. Based upon the fault history, the degradation in critical current may be calculated for a given fault event or series of fault events using the tape characteristic, such as shown in FIG. 6. Generally, the critical current of a superconductor tape may be affected by the energy of a pulse, as well as the number of pulses and amplitude of a pulse. For higher fault currents, a superconductor tape may degrade more rapidly, meaning at lower pulse energy, because less time is available for the superconductor tape to dissipate heat into the liquid nitrogen medium. Therefore, the cooling properties of liquid nitrogen are less effective, resulting in more rapid heating of the superconductor tape.

Figure 7:
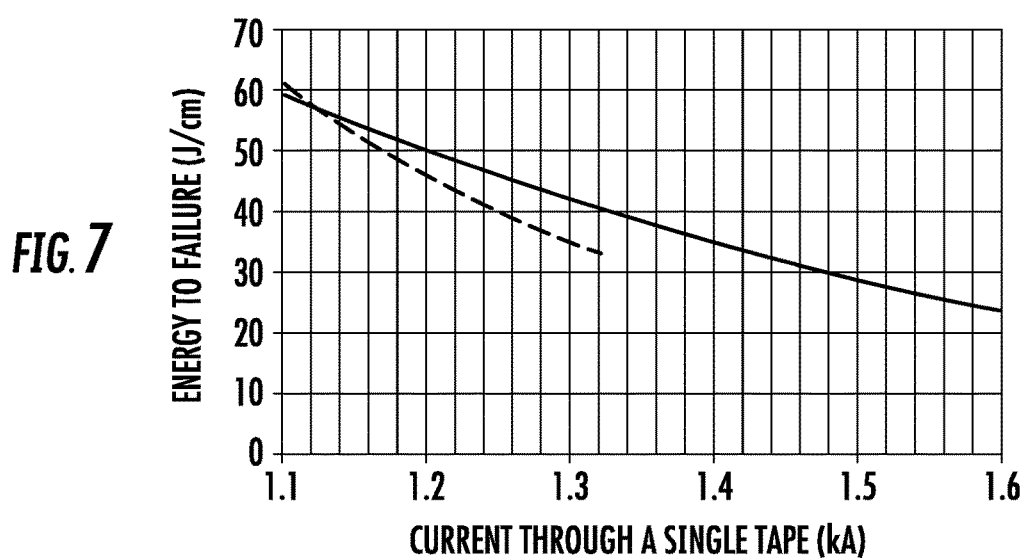
FIG. 7 illustrates the influence of pulse amplitude on energy till failure of a superconductor tape.

In accordance with various embodiments, the estimated lifetime of a superconductor tape may be determined, taking into account the current conducted through a superconductor tape during a fault event. As noted, higher fault currents may degrade a superconductor tape more rapidly, so less total energy may be needed for failure. FIG. 7 plots the energy to failure of a superconductor tape as a function of amplitude of pulse current through the tape, for two different types of tapes, shown in solid line, and dashed line. As shown, failure takes place at lower energy levels for higher current levels. In this case, failure may represent the case where the superconductor tape becomes resistive, heats up to levels where the superconductor tape burns, leading to open circuit conditions. For example, a current of 1.6 kA through a given tape may produce failure at an energy level of approximately 25 J/cm, while 60 J/cm energy is needed for failure at current levels of 1.1 kA/cm. Accordingly, by factoring in the current level, as well as energy dissipated in a fault event, or a series of fault events occurring up to a time T, the estimated lifetime of a superconductor tape at time T may be better determined.

In sum, various embodiments described herein provide systems and methods to monitor and manage operation of superconductor tapes in an SCFCL. A first advantage of the embodiments of the disclosure includes the ability to avoid failure of the superconductor tapes by providing a more accurate prediction of lifetime of the superconductor tapes while in use in the field. Another advantage is the ability to more efficiently utilize superconductor tapes. Since the present embodiments provide a more accurate determination of lifetime while the superconductor tapes are in use, unduly early replacement of tapes may also be avoided.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An apparatus for controlling a superconducting fault current limiter, comprising:
   a processor; and
   a memory unit coupled to the processor, including a lifetime routine, the lifetime routine operative on the processor to monitor the superconducting fault current limiter, the lifetime routine comprising:
      a lifetime estimation processor to:
         receive a set of fault information for a fault event of a superconductor tape of the superconducting fault current limiter;
         determine a present state of the superconductor tape based upon the fault information;
         determine an estimated lifetime of the superconductor tape based upon the present state;
         retrieve a fault history data of the superconductor tape;
         generate an updated fault history of the superconductor tape using the set of fault information and the fault history; and
         determine a critical current of the superconductor tape based upon the updated fault history, wherein the critical current is reduced if a number of fault events in the fault history increases.

2. The apparatus of claim 1, the set of fault information comprising a fault current amplitude of the fault event, a fault voltage of the fault event, a fault duration, calculated energy of the fault event, or any combination thereof.

3. The apparatus of claim 1, the lifetime estimation processor to:
   retrieve factory test information for the superconductor tape; and
   determine the estimated lifetime based upon the fault information, the factory test information, and the fault history.

4. The apparatus of claim 1, the lifetime routine further comprising a data management processor, the data management processor to: store the updated fault history in the memory unit.

5. The apparatus of claim 1, the lifetime estimation processor to:
   determine when the estimated lifetime is below a threshold; and
   send a warning signal related to the estimated lifetime when the estimated lifetime is below the threshold.

6. The apparatus of claim 2, wherein the set of fault information comprises data from the fault event and at least one additional fault event, data from the at least one additional fault event including a calculated energy level for the at least one additional fault event, and a current amplitude of the at least one additional fault event.

7. A superconducting fault current limiter system, comprising:
   a superconducting fault current limiter unit;
   a condition monitor, coupled to the superconducting fault current limiter unit; and
   a controller, coupled to the condition monitor, the controller comprising:
      a processor; and
      a memory unit coupled to the processor, including a lifetime routine, the lifetime routine operative on the processor to monitor the superconducting fault current limiter, the lifetime routine comprising a lifetime estimation processor to:
         receive a set of fault information for a fault event of a superconductor tape of the superconducting fault current limiter;
         determine a present state of the superconductor tape based upon the fault information;
         determine an estimated lifetime of the superconductor tape based upon the present state;
         retrieve fault history data of the superconductor tape;
         generate an updated fault history of the superconductor tape using the set of fault information and the fault history; and
         determine a critical current of the superconductor tape based upon the updated fault history, wherein the critical current is reduced if a number of fault events in the fault history increases.

8. The superconducting fault current limiter system of claim 7, further comprising:
   a current transformer, coupled to measure a current through the superconducting fault current limiter unit;
   a first potential transformer, connected to a first side of the superconducting fault current limiter a second potential transformer, connected to a second side of the superconducting fault current limiter unit, wherein the condition monitor is coupled to the current transformer, first potential transformer, and second potential transformer, to receive current information, and voltage information, generated at the superconducting fault e limiter unit.

9. The superconducting fault current limiter system of claim 7, the set of fault information comprising a fault current amplitude of the fault event, a fault voltage of the fault event, a fault duration, calculated energy of the fault event, or any combination thereof.

10. The superconducting fault current limiter system of claim 7, the lifetime estimation processor to:

retrieve factory test information for the superconductor tape; and determine the estimated lifetime based upon the fault information, the factory test information, and the fault history.

11. The superconducting fault current limiter system of claim 7, the lifetime estimation processor to:

determine when the estimated lifetime is below a threshold; and send a warning signal related to the estimated lifetime when the estimated lifetime is below the threshold.

12. The superconducting fault current limiter system of claim 7, wherein the set of fault information comprises data from the fault event and at least one additional fault event, data from the at least one additional fault event including a calculated energy level for the at least one additional fault event, and a current amplitude of the at least one additional fault event.

13. A method for controlling a superconducting fault current limiter, comprising:

receiving a set of fault information for a fault event of a superconductor tape of the superconducting fault current limiter;

determining a present state of the superconductor tape based upon the fault information;

determining an estimated lifetime of the superconductor tape based upon the present state, the set of fault information comprising a fault current amplitude of the fault event, a fault voltage of the fault event, a fault duration, calculated energy of the fault event, or any combination thereof; and retrieving a fault history data of the superconductor tape;

generating an updated fault history of the superconductor tape using the set of fault information and the fault history; and determining a critical current of the superconductor tape based upon the updated fault history, wherein the critical current is reduced if a number of fault events in the fault history increases.

14. The method of claim 13, further comprising:

retrieving factory test information for the superconductor tape; and determining the estimated lifetime based upon the fault information, the factory test information, and the fault history.

15. The method of claim 13, further comprising:

determining when the estimated lifetime is below a threshold; and sending a warning signal related to the estimated lifetime when the estimated lifetime is below the threshold.

* * * * *